United States Patent [19]
Yamaguchi

[11] Patent Number: 5,250,751
[45] Date of Patent: Oct. 5, 1993

[54] ELECTROMAGNETIC SHIELDING GASKET

[75] Inventor: Akio Yamaguchi, Kasugai, Japan

[73] Assignee: Kitagawa Industries Co., Ltd., Japan

[21] Appl. No.: 871,851

[22] Filed: Apr. 21, 1992

[30] Foreign Application Priority Data

Jul. 17, 1991 [JP] Japan .................. 3-176876

[51] Int. Cl.$^5$ .............................................. H05K 9/00
[52] U.S. Cl. .................. 174/35 GC; 174/35 R; 49/475.1
[58] Field of Search .......... 174/35 R, 35 MS, 35 GC; 361/424; 219/10.55 R, 10.55 D; 277/229, 230, 235 R; 49/475, 483, 485, 493, 494; 29/592.1, 868, 882

[56] References Cited

U.S. PATENT DOCUMENTS

| | | |
|---|---|---|
| 2,805,042 | 2/1958 | Tollefson et al. . |
| 2,844,644 | 7/1958 | Soule, Jr. et al. . |
| 3,277,230 | 10/1966 | Stickney et al. . |
| 3,366,918 | 1/1968 | Johnson et al. ............ 174/35 GC |
| 3,904,810 | 9/1975 | Kraus . |
| 4,761,516 | 8/1988 | Reichert .................. 174/35 GC |
| 4,769,966 | 9/1988 | Petri . |
| 4,803,306 | 2/1989 | Malmquist ............... 174/35 GC |
| 4,820,885 | 4/1989 | Lindsay .................. 174/35 GC |
| 4,929,802 | 5/1990 | Schaepers et al. . |
| 5,001,297 | 3/1991 | Peregrim et al. .......... 174/35 GC |
| 5,029,254 | 7/1991 | Stickney ................. 174/35 GC |
| 5,083,239 | 1/1992 | Sedlemeier et al. ........... 361/424 |

FOREIGN PATENT DOCUMENTS

| | | |
|---|---|---|
| 0222656 | 5/1987 | European Pat. Off. . |
| 2246199 | 10/1990 | Japan . |
| 37995 | 2/1991 | Japan . |
| 2212003 | 7/1989 | United Kingdom . |

Primary Examiner—Leo P. Picard
Assistant Examiner—Bot Ledynh
Attorney, Agent, or Firm—Davis, Bujold & Streck

[57] ABSTRACT

An electromagnetic shielding gasket attached to an end portion of a board member for contacting a desired contact portion and providing an electromagnetic shielding effect. The electromagnetic shielding gasket comprises a flat base portion linearly extending and having a width substantially equal to the thickness of the end portion of the board member. The gasket also comprises a plurality of pairs of resilient fingers arranged in an extending direction from the flat base portion. Each resilient finger transversely extends out from each side edge portion of the flat base portion. Some of the resilient fingers are bent downwardly toward one another, forming carrier strips for holding side walls of the board member therebetween. The other resilient fingers are bent downwardly or upwardly according to the position of the desired contact portion, forming resilient tabs for contacting the desired portion. The electromagnetic shielding gasket can be easily attached to the end portion of the board member using the carrier strips, and can contact any surface disposed relative to the board member using the resilient tabs.

7 Claims, 10 Drawing Sheets

ELECTROMAGNETIC SHIELDING GASKET

BACKGROUND OF THE INVENTION

This invention relates to an electromagnetic shielding gasket which is attached to a rim, an edge or other portion of a board member and creates an electrical contact with a desired contact portion, thus establishing an electromagnetic shielding effect.

Such an electromagnetic shielding gasket is proposed in the Japanese Laid-open Patent Application No. 2-246199 which discloses a shield structure for a high-frequency module. As shown in FIG. 10 of the drawings, a metallic case 103 is separated by a partition plate 101 into regions in which high-frequency circuits are mounted. A shield plate 107, described later, is attached to the partition plate 101 such that the partition plate 101 is in electrical contact with a lid 105 when it is in a closed position, thus obtaining an electromagnetic shielding effect.

The shield plate 107 is composed of an elongate main plate member 111 and two opposed side flaps 109 formed by folding both side portions of the shield plate 107 almost normal to the main plate member 111. When the shield plate 107 is attached to the partition plate 101, the side walls of the partition plate 101 are held between the side flaps 109. The shield plate 107 is provided with parallel resilient fins 113 formed by partially cutting the main plate member 111 in U shapes and raising the cut portions. Free ends of the resilient fins 113 contact the underside of the lid 105 when it is closed, thus providing an electromagnetic shielding effect.

As shown in FIG. 10, however, the resilient fins 113 can only contact the underside of the closed lid 105 which is almost normal to the partition plate 101. The resilient fins 113 fail to contact any surfaces which extend parallel to the side walls of the partition plate 101.

Furthermore, the resilient fins 113 are formed integrally with the main plate member 111, thus weakening the main plate member 111. When the shield plate 107 is attached to a narrower partition plate, the main plate member 111 and the integrally formed resilient fins 113 must also be narrow, thus decreasing the structural rigidity of the shield plate 107. Accordingly, the length of the resilient fins 113 is also limited.

SUMMARY OF THE INVENTION

Wherefore, an object of the invention is to provide an electromagnetic shielding gasket which can contact a desired contact portion of any surface disposed relative to a board member to which the electromagnetic shielding gasket is, mounted providing a wide variety of possible designs of the desired contact portion.

Other objects and benefits of the invention will become apparent form the detailed description which follows hereinafter when taken in conjunction with the drawing figures which accompany it.

To solve this and other objects, the invention provides an electromagnetic shielding gasket attached to an end or other portion of a board member for contacting a desired contact portion and providing an electromagnetic shielding effect. The electromagnetic shielding gasket comprises a flat base portion extending linearly and having a width substantially equal to a thickness of the end or other portion of the board member. The gasket also comprises a plurality of pairs of resilient fingers arranged in an extending direction of the flat base portion. Each resilient finger extends transversely out from each side edge portion of the flat base portion. Some of the resilient fingers are bent downwardly toward one another forming carrier or clamping strips for holding the side walls of the board member therebetween. The other resilient fingers are bent downwardly or upwardly, according to the position of the desired contact portion, forming resilient tabs for contacting the desired contact portion.

BRIEF DESCRIPTION OF THE DRAWINGS

The invention will now be described, by way of example, with reference to the accompanying drawings, in which.

DETAILED DESCRIPTION OF THE PREFERRED EMBODIMENTS

Figure 1A:
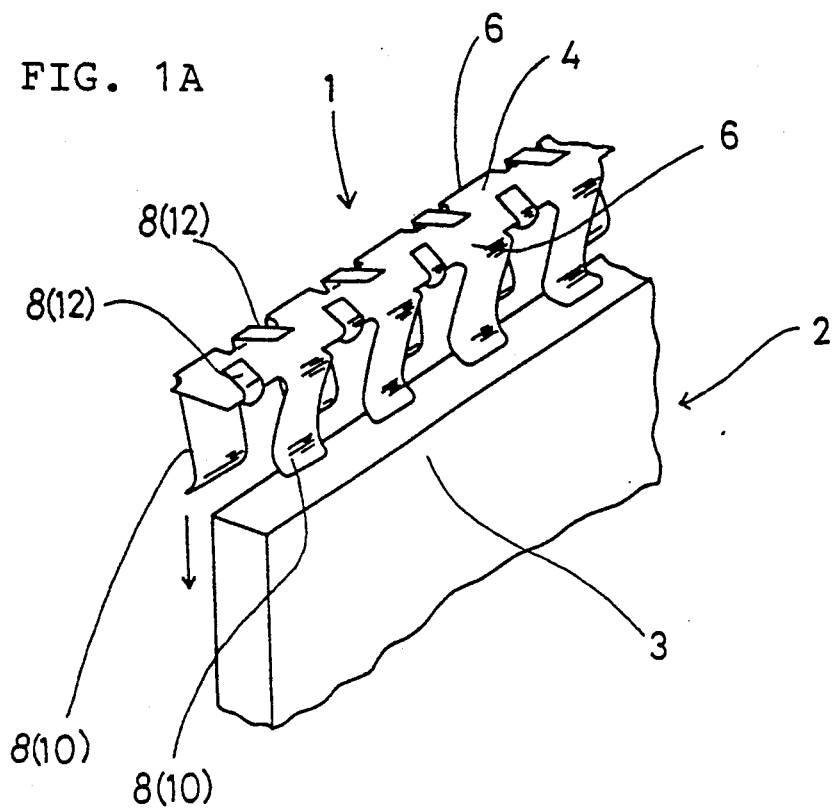
FIG. 1A is a perspective view of an electromagnetic shielding gasket of a first embodiment according to the invention.
Figure 1B:
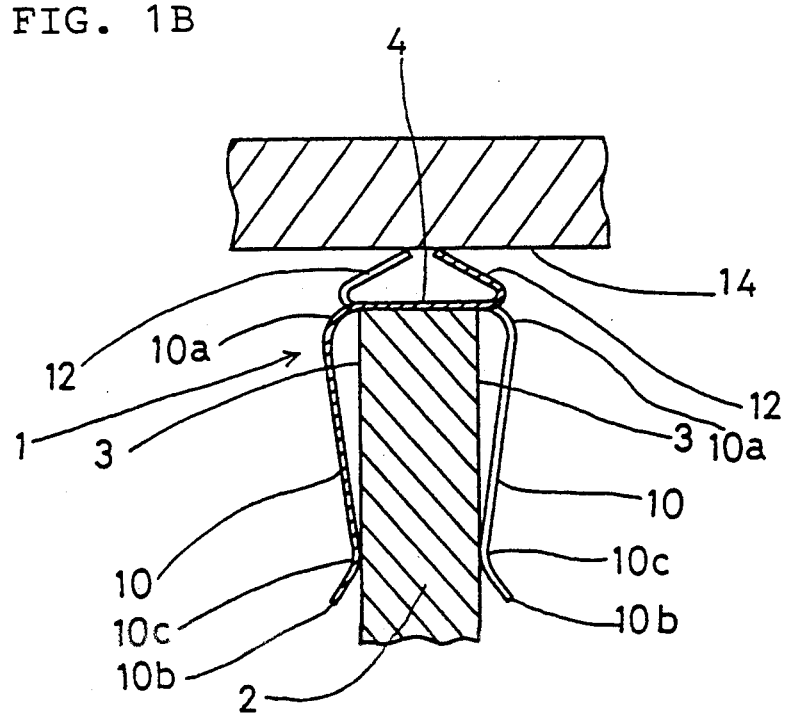
FIG. 1B is a cross-sectional view showing the electromagnetic shielding gasket attached to a board member.

As shown in FIGS. 1A and 1B, an electromagnetic shielding gasket 1 of a first embodiment according to the invention comprises a plurality of pairs of resilient fingers 8 arranged longitudinally along a base or flat portion 4. The flat portion 4 has a width substantially equal to the thickness of an end portion of a board member 2. The resilient fingers 8 of each pair project opposite to each other from respective side edges 6 of the flat portion 4.

One finger 8 of each pair is bent downwardly to form a carrier or clamping strip 10 such that a plurality of the carrier strips 10 alternately face inward along the longitudinal length of the flat portion 4. The carrier strips 10 are almost normal to a lateral reference axis or plane defined by the flat portion 4. As shown in FIG. 1B, the carrier strips 10 are curved inwardly adjacent connected ends 10a and outwardly toward free ends 10b, thus forming vertexes 10c between the connected ends 10a and the free ends 10b. The distance between the opposed vertexes 10c, as viewed in FIG. 1B, is slightly smaller than the thickness of the end portion of the board member 2.

The other finger 8 in each pair is bent upwardly in a direction opposite to the direction in which the adjoining carrier strip 10 is bent, thus forming a retention tab 12 having an angle of about 150 degrees from the lateral reference axis of the flat portion 4.

The fingers 8 alternately form the carrier strips 10 and the retention tabs 12 such that the carrier strips 10 as well as the retention tabs 12 are arranged in a zigzag pattern or fashion along the length of the flat portion 4.

In operation, the electromagnetic shielding gasket 1 is attached to the end portion of the board member 2 in a direction shown by an arrow (not labeled) in FIG. 1A by sliding side walls 3 of the board member 2 into position between the carrier strips 10. When the electromagnetic shielding gasket 1 is thus mounted, the carrier strips 10 are slightly opened and resiliently snapped against the side walls 3. The carrier strips 10 resiliently push upon the side walls 3 of the board member 2 from both sides because, as aforementioned, the width between the vertexes 10c is slightly smaller than the thickness of the board member 2. As shown in FIG. 1B, the retention tabs 12 of the attached electromagnetic shielding gasket 1 resiliently contact desired contact points of a member 14 disposed normal to the board member 2. The resulting electrical contact creates an electromagnetic shielding effect between the board member 2 and the desired contact points.

Further embodiments according to the invention will now be explained. The components of the further embodiments which are identical to those of the electromagnetic shielding gasket 1 of the first embodiment are denoted with the same last two numbers, and further detailed explanation of the identical components is omitted. Different features of the embodiments will now be explained.

Figure 2A:
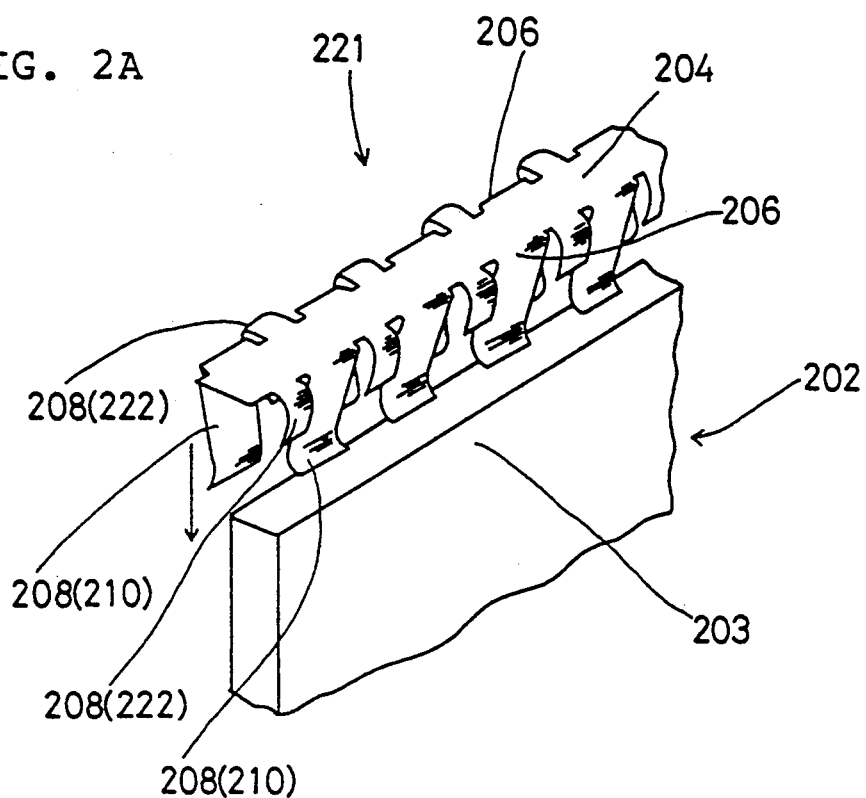
FIG. 2A is a perspective view of an electromagnetic shielding gasket of a second embodiment.

As shown in FIG. 2A, in an electromagnetic shielding gasket 221 of the second embodiment, one of resilient fingers 208 in each pair forms a carrier or clamping strip 210 and the other forms a retention tab 222. Different from the first embodiment, the retention tab 222 is bent in the same direction as the adjoining carrier strip 210. While the carrier strip 210 is bent downwardly almost normal to a flat portion 204 along a side edge 206, the retention tab 222 is bent downwardly at a smaller angle to form a semicircular arch projecting outside the adjoining carrier strip 210.

Figure 2B:
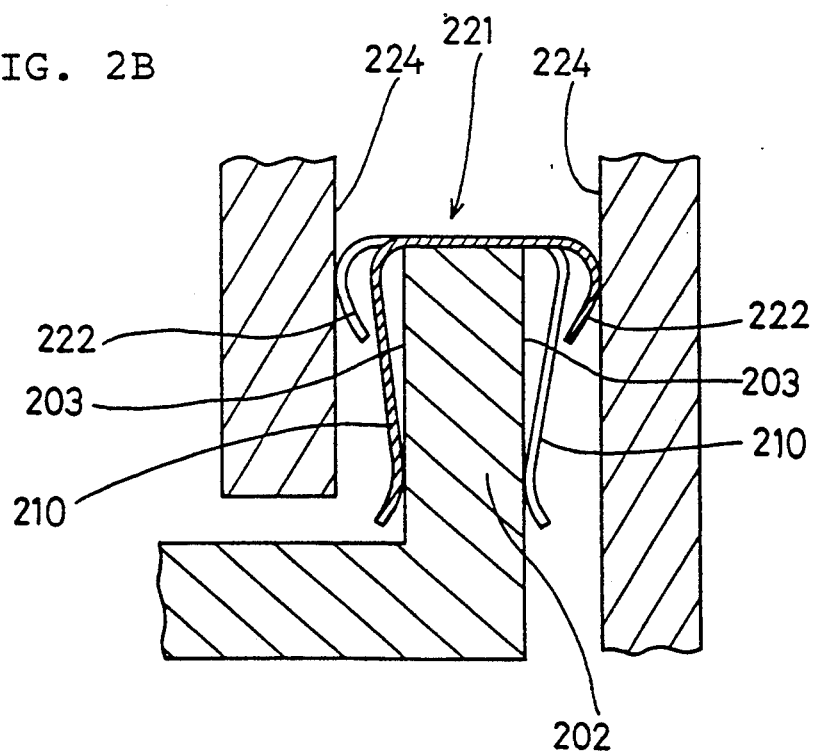
FIG. 2B is a cross-sectional view showing the electromagnetic shielding gasket attached to a board member.

In operation, as shown in FIG. 2B, when the electromagnetic shielding gasket 221 is mounted to a board member 202 with the carrier strips 210 holding both side walls 203, the retention tabs 222 can resiliently contact desired contact points of members 224 disposed parallel to and on both sides of the board member 202. The electrical contact between the board member 202 and the desired contact points provides an electromagnetic shielding effect.

Figure 3A:
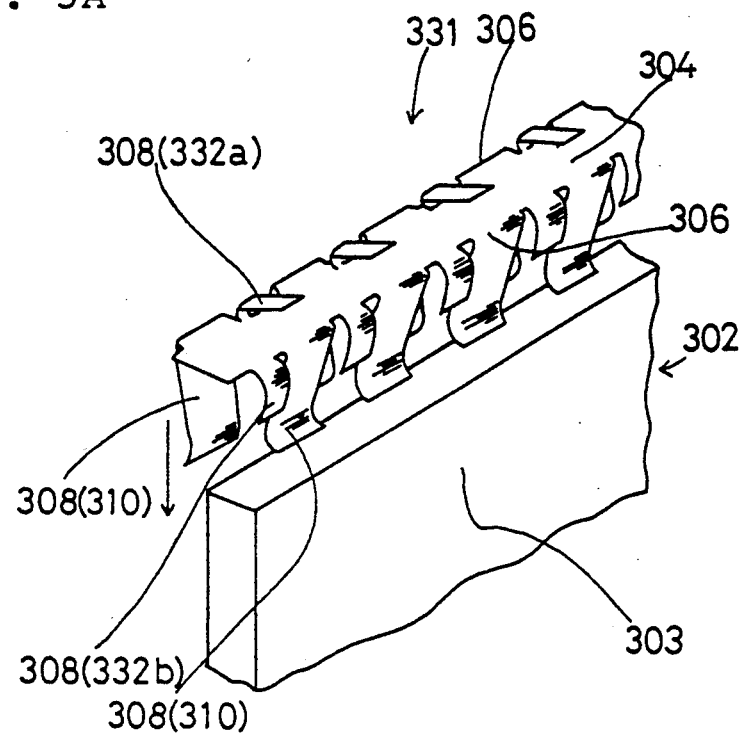
FIG. 3A is a perspective view of an electromagnetic shielding gasket of a third embodiment.

In a third embodiment, as shown in FIG. 3A, an electromagnetic shielding gasket 331 comprises carrier or clamping strips 310 formed by one of resilient fingers 308 in each pair. The other resilient finger 308 in each pair forms a retention tab 332a or 332b. A first group of alternating retention tabs 332a are bent upwardly in the same way as the retention tabs 12 of the first embodiment while a second group of alternating retention tabs 332b are bent downwardly in the same way as the retention tabs 222 of the second embodiment. The retention tabs 332a and 332b, respectively, are arranged in a zigzag fashion along the length of a flat portion 304.

Figure 3B:
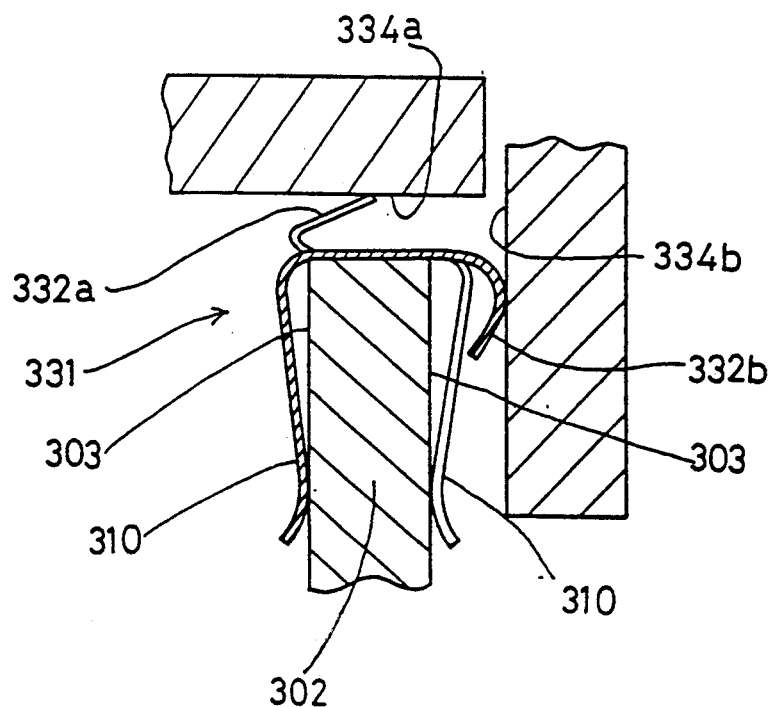
FIG. 3B is a cross-sectional view showing the electromagnetic shielding gasket attached to a board member.

In operation, as shown in FIG. 3B, when the electromagnetic shielding gasket 331 is mounted to a board member 302, the retention tabs 332a resiliently contact desired contact points of a member 334a disposed substantially normal to the board member 302. On the other hand, the retention tabs 332b resiliently contact desired contact points of a member 334b disposed parallel to the board member 302. Consequently, the board member 302 is in electrical contact with the members 334a and 334b for electromagnetic shielding.

As aforementioned, the electromagnetic shielding gaskets 1, 221, and 331 attached to the board members 2, 202, and 302, respectively, can contact surfaces provided normal to or parallel to the board members 2, 202, and 302. Specifically, the retention tabs 12, 222, 332a and 332b can contact the desired contact points of the members 14, 224, 334a and 334b disposed relative to the board members 2, 202, and 302, respectively. Thus the members to be put in electrical contact with the board members can have various designs.

In contrast to prior-art electromagnetic shielding gaskets, the retention tabs 12, 222, 332a and 332b are formed without cutting and raising portions of the flat portions 4, 204, and 304 and without impairing the overall structural rigidity. The width, length or other dimensions of the retention tabs 12, 222, 332a and 332b can be determined irrespective of the width of the flat portions 4, 204, and 304, thus enhancing the degree of freedom in designing the members to contact the electromagnetic shielding gaskets 1, 221, and 331.

Figure 4A:
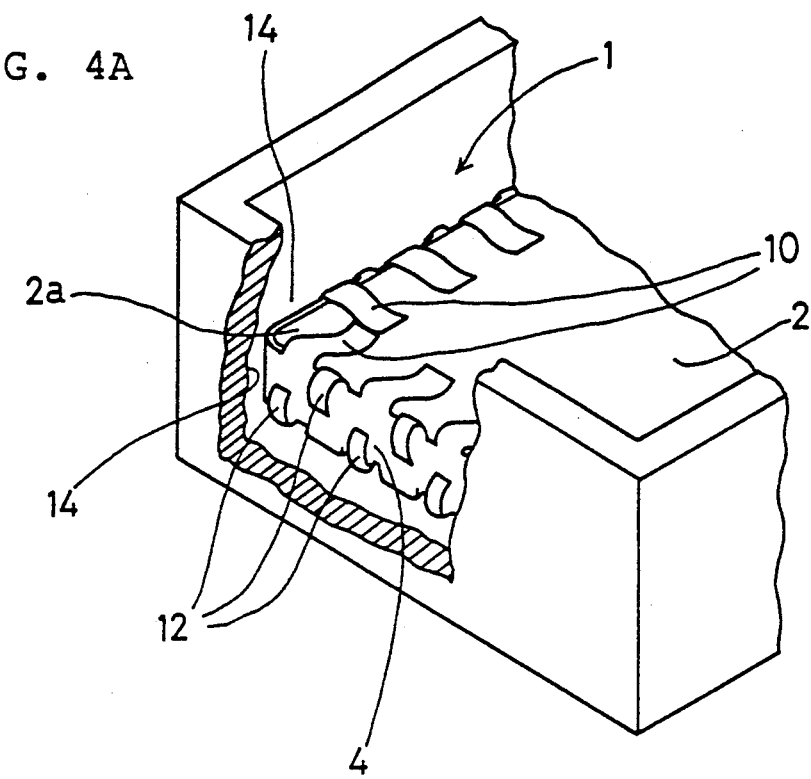
FIG. 4A is a partially cut away perspective view showing another application of the electromagnetic shielding gasket of the first embodiment.

In another operation of the first embodiment, as shown in FIG. 4A, the electromagnetic shielding gasket 1 is attached to the board member 2 having a corner 2a. As aforementioned, the carrier strips 10 are arranged in a zigzag fashion along the length of the flat portion 4. At least one retention tab 12 is positioned between the adjacent carrier strips 10 on the same side edge 6 of the flat portion 4. Therefore, as shown in FIG. 4A, the electromagnetic shielding gasket 1 can be attached to the board member 2 by bending the flat portion 4 such that the corner 2a is positioned between the adjacent carrier strips 10. Even when the member 14 is right-angled, the retention tabs 12 resiliently contact the desired contact points of the members 14. Thus the board member 2 and the member 14 can thus be electromagnetically shielded by only a single piece of the electromagnetic shielding gasket 1.

Figure 4B:
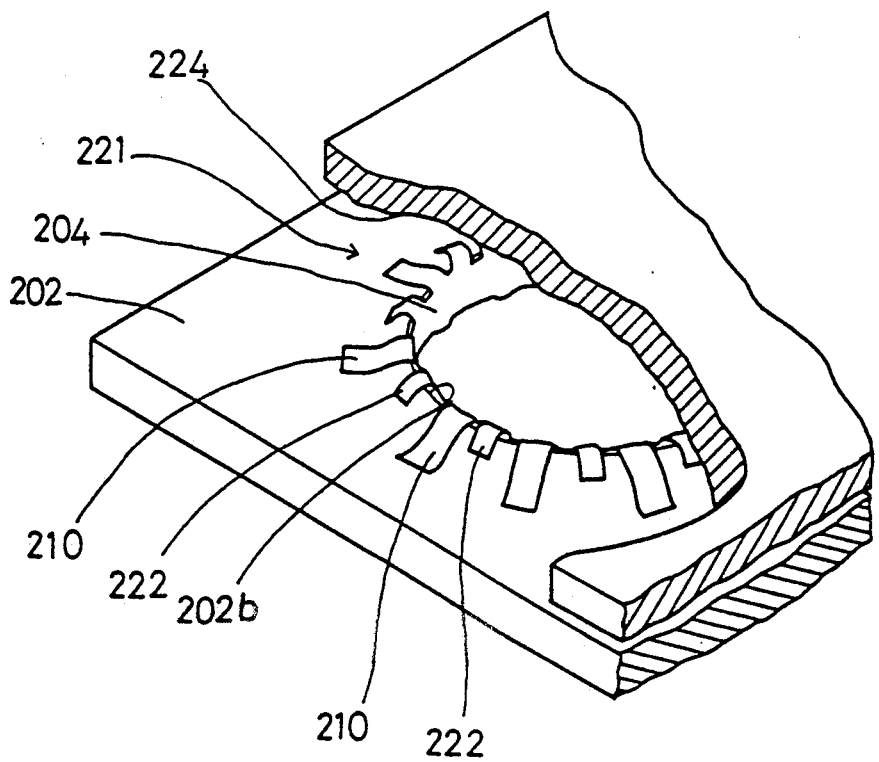
FIG. 4B is a partially cut away perspective view showing another application of the electromagnetic shielding gasket of the second embodiment.

In another operation of the second embodiment, as shown in FIG. 4B, the electromagnetic shielding gasket 221 is attached to the periphery of a round through hole 202b extending through the board member 202. By bending the flat portion 204 annularly along the periphery of the through hole 202b, the carrier strips 210 and the retention tabs 222 are positioned radially about the periphery of the through hole 202b. By attaching a single piece of the electromagnetic shielding gasket 221 to the periphery of the through hole 202b, the retention tabs 222 resiliently contact the desired contact points of the members 224 extending parallel to both sides of the board member 202, thus providing an electromagnetic shielding effect.

Modifications of the embodiments will now be explained.

Figure 5A:
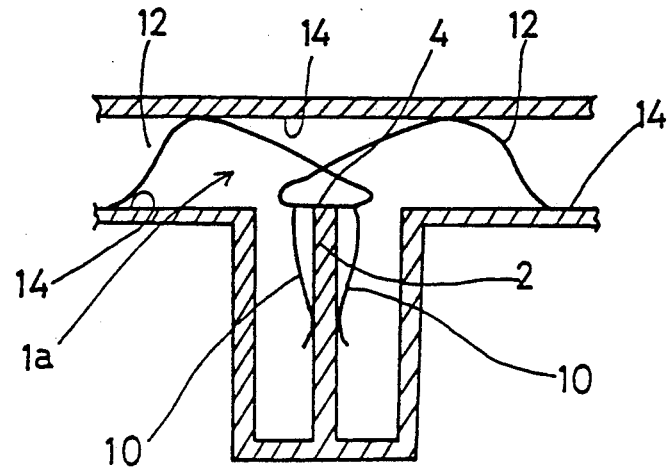
FIGS. 5A and 5C are cross-sectional views showing modifications to the electromagnetic shielding gasket of the first embodiment.

In a modification to the first embodiment, as shown in FIG. 5A, an electromagnetic shielding gasket 1a is composed of the retention tabs 12, which are bent upwardly, cross each other and extend to contact resiliently the desired points of the contact members 14.

Figure 5B:
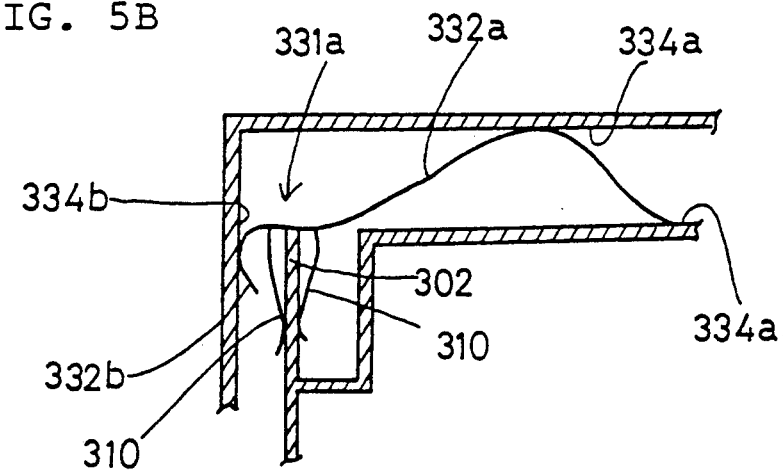
FIG. 5B is a cross-sectional view showing a modification to the electromagnetic shielding gasket of the third embodiment.

In a modification to the third embodiment, as shown in FIG. 5B, an electromagnetic shielding gasket 331a is composed of the retention tabs 332a, which are bent upwardly forming an angle of about 30 degrees with the lateral reference line of the flat portion 304, extend long to the right as viewed in FIG. 5B, and resiliently contact the desired points of the contact members 334a.

Figure 5C:
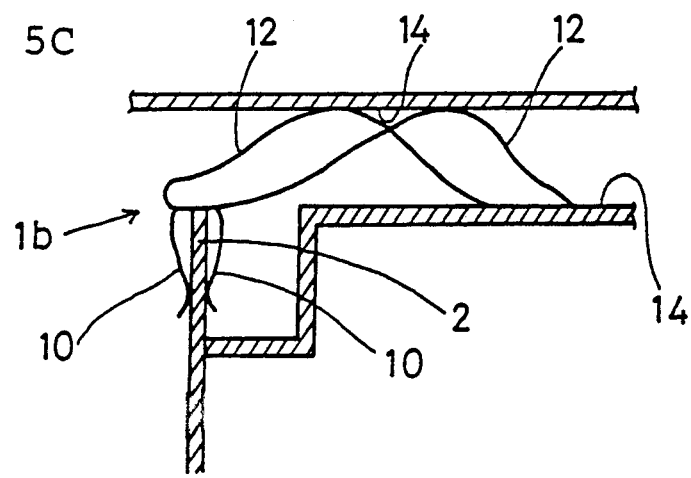

In another modification to the first embodiment, as shown in FIG. 5C, an electromagnetic shielding gasket 1b is composed of the retention tabs 12 disposed on one side of the flat portion 4 which are bent upwardly forming an angle of about 150 degrees with the lateral reference line of the flat portion 4. The retention tabs 12 on the other side of the flat portion 4 are bent upwardly forming an angle of about 30 degrees with the lateral reference line of the flat portion 4. The retention tabs 12 on both sides extend to the right, as viewed in FIG. 5C, resiliently contact the desired points of the contact members 14, and curve downwardly toward their free or terminal ends.

Figure 6A:
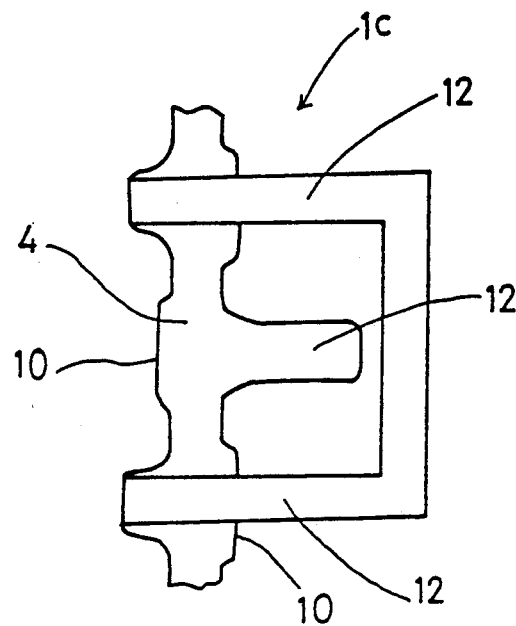
FIG. 6A is a plan view showing further modification to the electromagnetic shielding gasket shown in FIG. 5A.
Figure 6B:
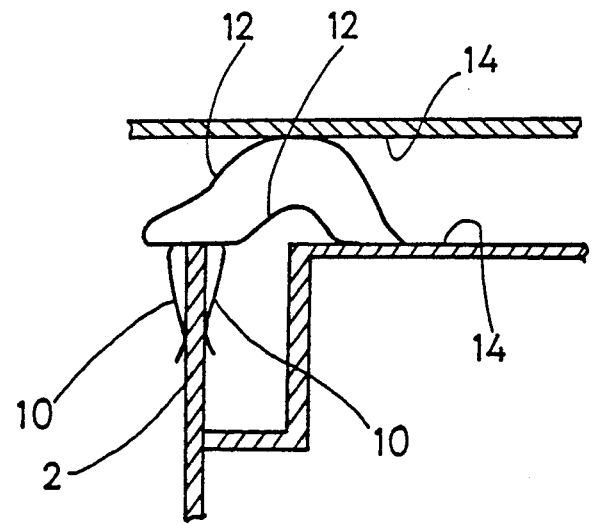
FIG. 6B is a cross-sectional view showing the modified electromagnetic shielding gasket attached to the board member.

In a further modification to the first embodiment, as shown in FIGS. 6A and 6B, an electromagnetic shielding gasket 1c is composed of the retention tabs 12 similar to those of the electromagnetic shielding gasket 1b as shown in FIG. 5C. Different from the electromagnetic shielding gasket 1b, the free ends of the adjoining retention tabs 12 on the same side of the flat portion 4 are interconnected as shown in FIG. 6A. Therefore, as shown in FIG. 6B, the contact area between the retention tabs 12 and the contact members 14 is enlarged, thus providing an effective electromagnetic shielding and strengthening the electromagnetic shielding gasket 1c.

The combination of the electromagnetic shielding gaskets with at least one meshed metal material for other applications will now be explained with reference to FIGS. 7 through 9.

Figure 7:
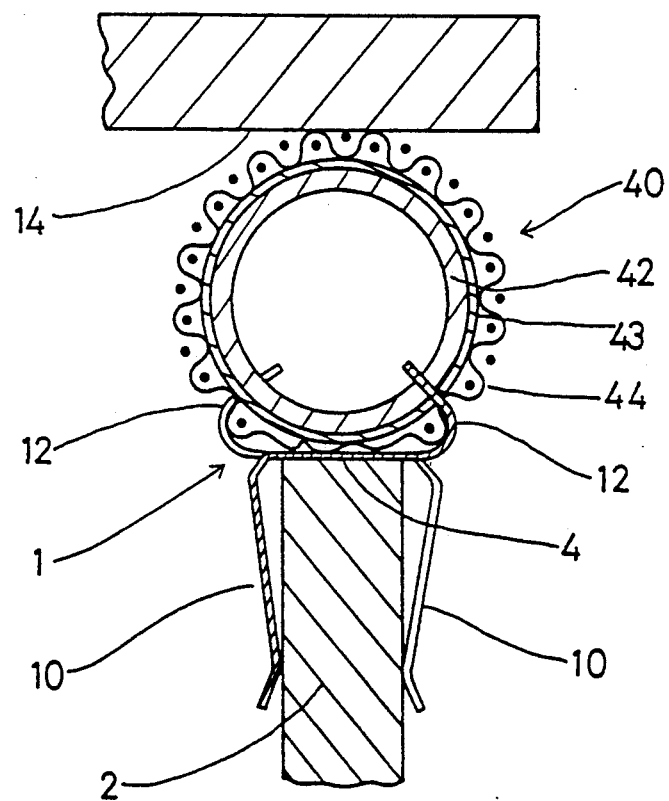
FIG. 7 is a cross-sectional view showing the electromagnetic shielding gasket of the first embodiment combined with a metallic mesh material.

In another operation of the electromagnetic shielding gasket 1 of the first embodiment, as shown in FIG. 7, the board member 2 is held between the carrier strips 10, while a metallic mesh material 40 is held between the retention tabs 12. The metallic mesh material 40 has therein a cylindrical core material 42 formed of flexible sponge rubber, silicone rubber or other elastomeric material. A meshed metal 44 formed of interwoven metallic wires is disposed around the core material 42. A resin layer 43 is provided on the outer periphery of the core material 42 and secures the meshed metal 44 to the core material 42. The retention tabs 12 extend through the meshed metal 44, the resin layer 43 and the cylindrical core material 42. The metallic mesh material 40 is held along the flat portion 4 of the electromagnetic shielding gasket 1. Thus the held metallic mesh material 40 can resiliently contact the desired points of the contact member 14 because the meshed metal 44 and the cylindrical core material 42 are both resilient. Thus a sufficient electromagnetic shielding effect is provided.

Figure 8:
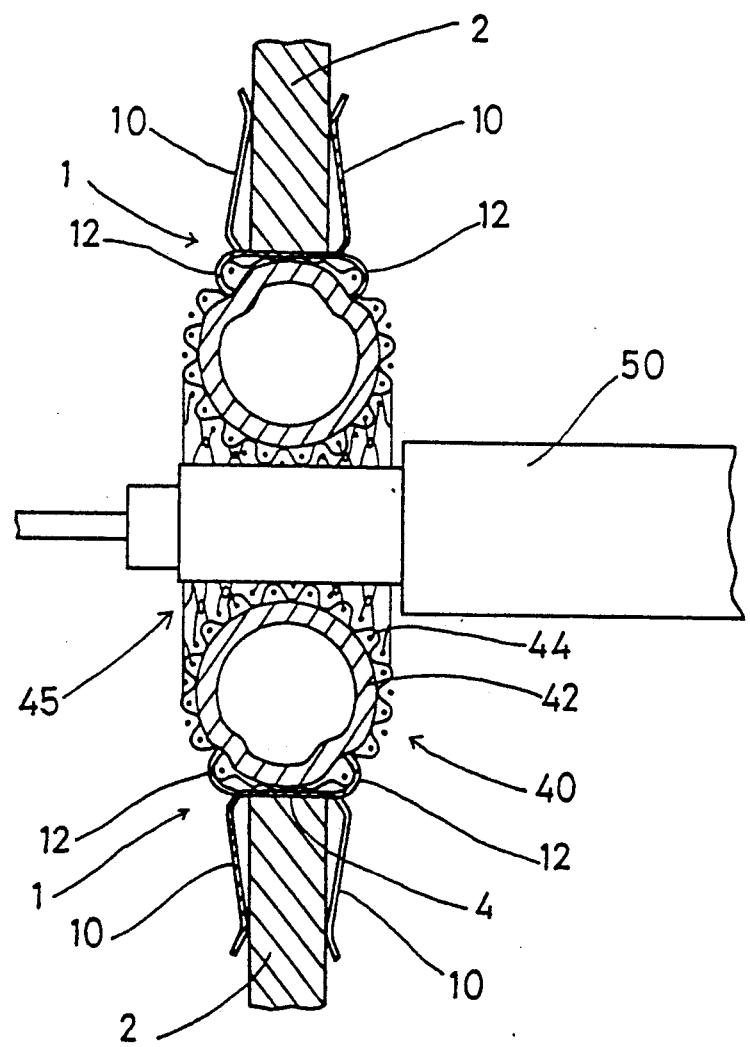
FIG. 8 is a partial cross-sectional view showing the electromagnetic shielding gasket of the first embodiment combined with the metallic mesh materials for the application as a grounding material of a coaxial cable.

In a further operation of the first embodiment, as shown in FIG. 8, the electromagnetic shielding gasket 1 is used as a grounding material for a coaxial cable 50. The electromagnetic shielding gasket 1 is attached to the periphery of a round hole in the board member 2, and the metallic mesh material 40, of a circular shape, is held annularly along the flat portion 4 by the retention tabs 12, thus defining a hollow 45 for receiving the coaxial cable 50. Specifically, when the metallic mesh material 40 is inserted between the retention tabs 12, the retention tabs 12 are slightly opened and then resiliently restored to their original configuration, thereby holding the metallic mesh material 40 therebetween. Therefore, passing the retention tabs 12 through the core material 42 is not required. By inserting the coaxial cable 50 into the hollow 45 defined by the annularly held metallic mesh material 40, the meshed metal 44 contacts the periphery of the coaxial cable 50, thus providing a sufficient electromagnetic shielding effect.

In the operations of the electromagnetic shielding gasket 1 as shown in FIGS. 7 and 8, the retention tabs 12, provided on both sides of the flat portion 4, hold a single piece of the metallic mesh material 40. However, two pieces of the metallic mesh material 40 can be combined with a single piece of the electromagnetic shielding gasket by holding the metallic mesh materials with the retention tabs on both sides as shown in FIGS. 9A and 9B.

Figure 9A:
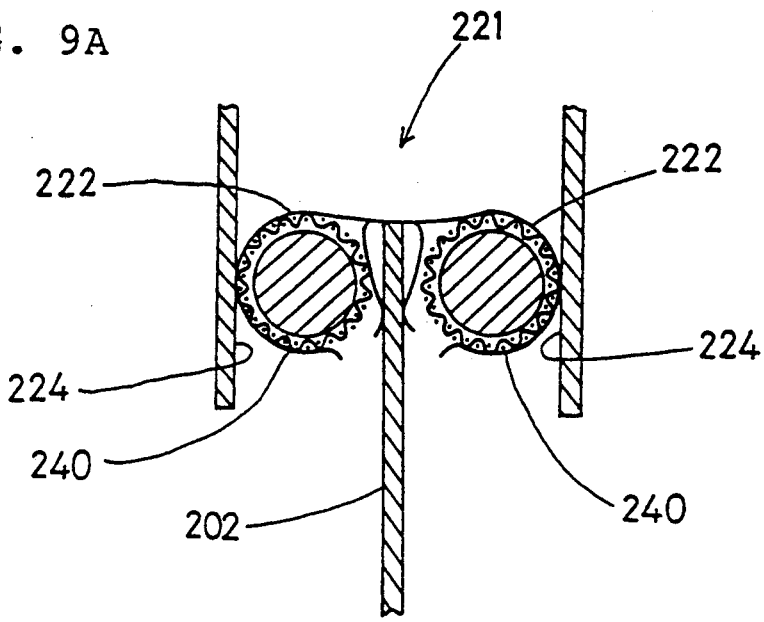
FIGS. 9A and 9B are cross-sectional views showing the combination of the metallic mesh materials with the electromagnetic shielding gasket of the second and third embodiments, respectively.

In a modification to the electromagnetic shielding gasket 221 of the second embodiment, as shown in FIG. 9A, the retention tabs 222 extend a desired distance, are curved downwardly, and form chords for encompassing metallic mesh materials 240 on the respective sides of the board member 202. The retention tabs 222 and the metallic mesh materials 240 held therein contact the desired points of the contact members 224 provided parallel to the board member 202. As a result, a large contact area can be obtained, thus providing an effective electromagnetic shield.

Figure 9B:
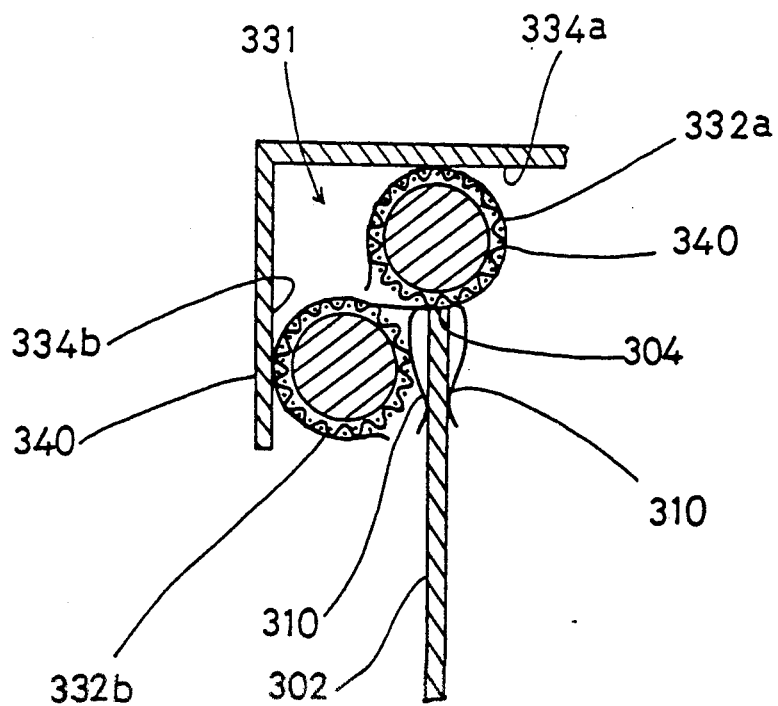
Figure 10:
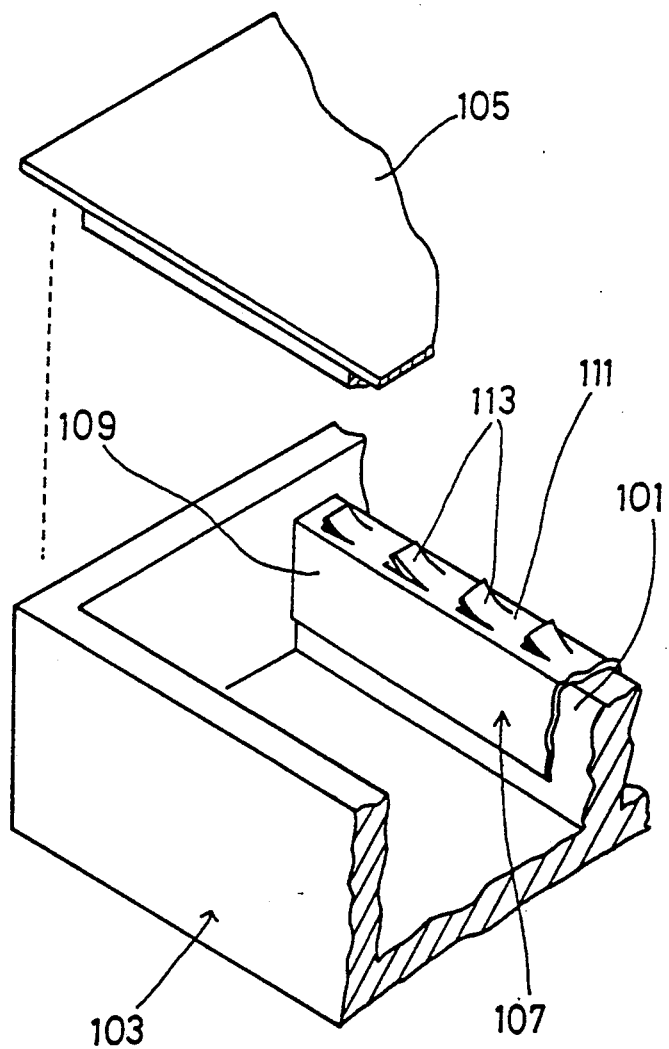
FIG. 10 is a schematic perspective view of a prior-art electromagnetic shielding gasket.

In another modification to the electromagnetic shielding gasket 331 of the third embodiment, as shown in FIG. 9B, the retention tabs 332a encompass a metallic mesh material 340 which is supported along the flat portion 304. On the other hand, the retention tabs 332b encompass another metallic mesh material 340 which is held at the side of the board member 302. The retention tabs 332a and the metallic mesh material 340 held therein contact the desired points of the contact member 334a extending normal to the board member 302, while the retention tabs 332b and the metallic mesh material 340 held therein contact the desired points of the contact member 334b extending parallel to the board member 302. Thus an effective electromagnetic shield can be obtained.

In the aforementioned embodiments, the cross section of the core material 42 is circular. The cross section, however, is not limited to a circular one, and may be semicircular, V-shaped, Y-shaped, or in other shapes.

This invention has been described above with reference to preferred embodiments as shown in the drawings. Modifications and alterations may become apparent to one skilled in the art upon reading and understanding the specification. Despite the use of embodiments for illustration purposes, however, it is intended to include all such modifications and alterations within the scope and spirit of the appended claims.

Wherefore, having thus described the present invention, what is claimed is:

1. An electromagnetic shielding gasket for attaching to a board member and engaging a desired contact portion of an adjacent member to provide electromagnetic shielding, said electromagnetic shielding gasket comprising:

an elongate flat base portion having a width substantially equal to a thickness of a desired portion of said board member to which said electromagnetic shielding gasket is to be attached;

a plurality of pairs of resilient fingers being arranged along a longitudinal direction of said base portion, each of said pairs of resilient fingers projecting from a side edge portion of said base portion;

a first set of said resilient fingers being bent toward one another to form clamping means for releasably clamping and securing said electromagnetic shielding gasket to the desired portion of said board member; and a second set of resilient fingers being configured to facilitate contact of said electromagnetic shielding gasket with the desired contact portion of said adjacent member;

each pair of said plurality of pairs of resilient fingers comprising a resilient finger of said first set and a resilient finger of said second set and said resilient fingers of said first and said second sets, respectively, being arranged in an alternating pattern along the longitudinal length of said base portion;

wherein said second set of resilient fingers engage a meshed metal material for facilitating contact with the desired contact portion of a said adjacent member said meshed metal material comprises:

a resilient cylindrical core material;

a metallic mesh disposed around said core material; and a resin layer provided on an outer periphery of the core material for securing the metallic mesh to the core material.

2. An electromagnetic shielding gasket according to claim 1, wherein said first set of said resilient fingers each has a first end integral with one of the side edges of said base portion and a second distal free end bent in a first direction extending substantially normal to said base portion, each of said resilient fingers of said first set having a vertex formed adjacent its distal free end, and the vertexes being spaced from one another by a distance slightly smaller than the thickness of the desired portion of said board member to which said electromagnetic shielding gasket is to be attached; and said second set of said resilient fingers being bent in a second direction opposite the first direction and forming tabs shaped to contact the desired contact portion of a said adjacent member when disposed substantially normal to said board member.

3. An electromagnetic shielding gasket according to claim 1, wherein said meshed metal material has a circular shape and said elongate electromagnetic shielding gasket is deformed into a circular configuration with said first set of resilient fingers projecting outwardly for engaging a through hole of said board member to which the electromagnetic shielding gasket is to be attached and said second set of resilient fingers projecting inwardly for engaging and securing said meshed metal material of circular shape.

4. An electromagnetic shielding gasket for attaching to a board member and engaging a desired contact portion of an adjacent member to provide electromagnetic shielding, said electromagnetic shielding gasket comprising;

an elongate flat base portion having a width substantially equal to a thickness of a desired portion of said board member to which said electromagnetic shielding gasket is to be attached;

a plurality of pairs of resilient fingers being arranged along a longitudinal direction of said base portion, each of said pairs of resilient fingers projecting from a side edge portion of said base portion;

a first set of said resilient fingers being bent toward one another to form clamping means for releasably clamping and securing said electromagnetic shielding gasket to the desired portion of said board member; and a second set of resilient fingers being configured to facilitate contact of said electromagnetic shielding gasket with the desired contact portion of said adjacent member;

each pair of said plurality of pairs of resilient fingers comprising a resilient finger of said first set and a resilient finger of said second set and said resilient fingers of said first and said second sets, respectively, being arranged in an alternating pattern along the longitudinal length of said base portion;

wherein said resilient fingers of said second set, bent along a first longitudinal side of said base portion, engage a first meshed metal material and said resilient fingers of said second set, bent along a second longitudinal side of said base portion, engage a second meshed metal material for facilitating contact with the desired contact portions of two said adjacent members, each of said meshed metal materials comprises:

a resilient cylindrical core material;

a metallic mesh disposed around said core material; and a resin layer provided on an outer periphery of the core material for securing the metallic mesh to the core material.

5. An electromagnetic shielding gasket according to claim 4, wherein said first set of said resilient fingers each has a first end integral with one of the side edges of said base portion and a second distal free end bent in a first direction extending substantially normal to said base portion, each of said resilient fingers of said first set having a vertex formed adjacent its distal free end, and the vertexes being spaced from one another by a distance slightly smaller than the thickness of the desired portion of said board member to which said electromagnetic shielding gasket is to be attached.

6. An electromagnetic shielding gasket according to claim 4, wherein said second set of said resilient fingers is bent in the same direction as said first set of said resilient fingers, at a smaller angle than said first set of resilient fingers, and is formed into semicircular arches on both sides of said base portion, shaped to contact the desired contact portion of a said adjacent member when disposed substantially parallel to said board member.

7. An electromagnetic shielding gasket according to claim 4, wherein the second set of said resilient fingers comprises a first group and a second group;

said first group of alternating resilient fingers of said second set being bent in a second direction opposite a first direction, the first direction being the direction in which said first set of resilient fingers is bent, and forming tabs shaped to contact the desired contact portion of a said adjacent member when disposed substantially normal to said board member;

said second group of alternating resilient fingers of said second set being bent in said first direction, at a smaller angle than said first set of resilient fingers, and being formed into semicircular arches shaped to contact the desired contact portion of a said adjacent member when disposed substantially parallel to said board member; and said first group engaging said first meshed metal material for facilitating contact with the desired contact portion of a first said adjacent member when disposed substantially normal to said board member and said second group engaging said second meshed metal material for facilitating contact with the desired contact portion of a second said adjacent member, when disposed substantially parallel to said board member.

* * * * *